United States Patent
Etheridge

(10) Patent No.: US 7,537,799 B2
(45) Date of Patent: May 26, 2009

(54) METHODS OF FORMING ELECTRICALLY CONDUCTIVE PATHWAYS USING PALLADIUM ALIPHATIC AMINE COMPLEXES

(75) Inventor: Tom Etheridge, Corvallis, OR (US)

(73) Assignee: Hewlett-Packard Development Company, L.P., Houston, TX (US)

(*) Notice: Subject to any disclaimer, the term of this patent is extended or adjusted under 35 U.S.C. 154(b) by 888 days.

(21) Appl. No.: 10/618,522

(22) Filed: Jul. 11, 2003

(65) Prior Publication Data

US 2005/0005820 A1    Jan. 13, 2005

(51) Int. Cl.
*B05D 5/12*    (2006.01)
*B05D 1/18*    (2006.01)
*B05D 3/04*    (2006.01)

(52) U.S. Cl. .............. 427/98.4; 427/99.1; 427/301; 427/304; 427/437; 427/443.1; 427/258

(58) Field of Classification Search ............ 427/98.4, 427/99.1, 301, 304, 437, 443.1, 258
See application file for complete search history.

(56) References Cited

U.S. PATENT DOCUMENTS

| | | | | |
|---|---|---|---|---|
| 3,222,218 | A | * 12/1965 | Beltzer et al. ............. | 427/243 |
| 3,846,138 | A | * 11/1974 | Gulla ...................... | 106/1.26 |
| 3,896,252 | A | * 7/1975 | Tuttle ..................... | 427/306 |
| 4,285,991 | A | * 8/1981 | Gedrat et al. ............. | 216/18 |
| 4,406,755 | A | 9/1983 | Morrissey | |
| 4,454,010 | A | 6/1984 | Trop | |
| 4,486,274 | A | 12/1984 | Abys et al. | |
| 4,584,316 | A | 4/1986 | Rosenberg | |
| 4,668,533 | A | * 5/1987 | Miller ..................... | 427/98.5 |
| 5,120,578 | A | * 6/1992 | Chen et al. ............... | 427/304 |
| 5,549,810 | A | 8/1996 | Herklotz | |
| 5,882,736 | A | 3/1999 | Stein et al. | |
| 6,221,140 | B1 | 4/2001 | Kobayashi et al. | |
| 6,257,732 | B1 | * 7/2001 | Takahagi et al. ........... | 359/883 |
| 6,413,790 | B1 | 7/2002 | Duthaler et al. | |
| 6,429,580 | B1 | 8/2002 | Kobayashi et al. | |
| 6,487,774 | B1 | 12/2002 | Nakao et al. | |
| 6,563,057 | B2 | 5/2003 | Hotta et al. | |
| 2002/0134984 | A1 | 9/2002 | Igarashi | |
| 2003/0068581 | A1 | 4/2003 | Kawamura et al. | |
| 2005/0199587 | A1 | * 9/2005 | Bengston ................... | 216/83 |

FOREIGN PATENT DOCUMENTS

| | | |
|---|---|---|
| EP | 0736890 | 10/1996 |
| EP | 0769796 | 4/1997 |

OTHER PUBLICATIONS

Guo, Tzung-Fang, Shun-Chi Chang, Seungmoon Pyo, and Yang Yang, "Vertically Integrated Electronic Circuits via a Combination of Self-Assembled Polyelectrolytes, Ink-Jet Printing, and Electroless Metal Plating Processes," LANGMUIR 2002, 18, 8142-8147.

* cited by examiner

Primary Examiner—Brian K Talbot

(57) ABSTRACT

An ink-jettable composition including a palladium aliphatic amine complex solvated in a liquid vehicle can be used in formation of electronic devices. The ink-jettable composition containing a palladium aliphatic amine complex can be jetted onto a substrate in a predetermined pattern. A second composition can also be applied to the substrate using ink-jet printing or other printing techniques, wherein the second composition is applied onto at least a portion of the predetermined pattern. The second composition can include a reducing agent which is capable of reducing the palladium aliphatic amine complex to palladium metal, typically upon the application of heat. The described ink-jettable palladium complex compositions can be stable over a wide range of conditions and allow for the formation electronic devices on a variety of substrates.

18 Claims, No Drawings

METHODS OF FORMING ELECTRICALLY CONDUCTIVE PATHWAYS USING PALLADIUM ALIPHATIC AMINE COMPLEXES

FIELD OF THE INVENTION

The present invention relates generally to printing of circuitry. More specifically, the present invention relates to forming conductive patterns using ink-jet technology.

BACKGROUND OF THE INVENTION

Computer printer technology has evolved to a point where very high-resolution images can be transferred to various types of media. Ink-jet printing involves the placement of small drops of a fluid ink onto a media surface in response to a digital signal. Common ink-jet printing methods include thermal ink-jet and piezoelectric ink-jet technologies. Typically, the fluid ink is placed or jetted onto the surface without physical contact between the printing device and the surface. There are several reasons that ink-jet printing has become a popular way of recording images on various media surfaces, particularly paper. Some of these reasons include low printer noise, capability of high-speed recording, and multi-color recording. Additionally, these advantages can be obtained at a relatively low price to consumers.

Production of circuits and conductive traces has been accomplished in many different ways. Further, various methods for manufacturing printed circuit boards are known. Typical methods for manufacturing printed circuits include print and etch, screen printing, and photoresist methods, e.g., applying photoresist, exposing, and developing. Frequently these methods involve considerable capital costs and restrictions on production times. In recent year, ink-jet technologies have been used to form circuitry. These ink-jet technologies include a variety of methods which have met with varying degrees of success. Some of these methods involve ink-jetting of a precursor material which aids in deposition of conductive metals. Other methods involve printing of conductive inks onto a substrate. Each of these methods has disadvantages which limit their effectiveness, such as expense, reliability, and complexity. Accordingly, investigations continue into developing improved circuit fabrication techniques and compositions for use in ink-jet technologies.

SUMMARY OF THE INVENTION

It has been recognized that it would be advantageous to develop inexpensive and simple methods for forming conductive patterns, such as circuits.

In one aspect of the present invention, an ink-jettable composition comprises a palladium aliphatic amine complex solvated in a liquid vehicle.

Another aspect of the present invention includes a method of forming an electrically conductive pathway using ink-jet technology and ink-jettable compositions. A first ink-jettable composition can be jetted onto a substrate in a predetermined pattern. The first ink-jettable composition can include a liquid vehicle and a palladium aliphatic amine complex solvated therein. A second composition containing a reducing agent can be applied onto at least a portion of the predetermined pattern. Heat can then be applied to the predetermined pattern sufficient to cause reaction between the reducing agent and the palladium aliphatic amine complex to form palladium metal without substantially altering the substrate.

Yet another aspect of the present invention includes a system for printing conductive patterns on a substrate using ink-jettable compositions having a first printhead, a second printhead, and a heating apparatus. The first printhead includes a first firing chamber reservoir containing a first ink-jettable composition including a palladium aliphatic amine complex. The second printhead can have a second firing chamber reservoir containing a second ink-jettable composition including a reducing agent, which can be overprinted or underprinted on a substrate with respect to the palladium aliphatic amine complex. The heating apparatus can be configured to be in thermal contact with the substrate.

Additional features and advantages of the invention will be apparent from the detailed description which illustrates, by way of example, features of the invention.

DETAILED DESCRIPTION OF THE PREFERRED EMBODIMENT(S)

Before particular embodiments of the present invention are disclosed and described, it is to be understood that this invention is not limited to the particular process and materials disclosed herein as such may vary to some degree. It is also to be understood that the terminology used herein is used for the purpose of describing particular embodiments only and is not intended to be limiting, as the scope of the present invention will be defined only by the appended claims and equivalents thereof.

In describing and claiming the present invention, the following terminology will be used.

The singular forms "a," "an," and "the" include plural referents unless the context clearly dictates otherwise. Thus, for example, reference to "a reducing agent" includes reference to one or more of such materials.

As used herein, "liquid vehicle" is defined to include liquid compositions that can be used to carry a palladium aliphatic amine complex, a reducing agent, and optionally, colorants to a substrate. Liquid vehicles are well known in the art, and a wide variety of ink vehicles may be used in accordance with embodiments of the present invention. Such liquid vehicles may include a mixture of a variety of different agents, including without limitation, surfactants, solvents, co-solvents, buffers, biocides, viscosity modifiers, stabilizing agents, and water. Though a variety of agents are described that can be used, the liquid vehicle, in some embodiments, can be simply a single liquid component, such as water.

As used herein, "aliphatic" refers to hydrocarbons having straight or branched carbon chains. For example, a compound containing an aromatic ring is not considered an aliphatic compound. Similarly, compounds containing carboxyl groups such as amino acids and other carboxylic acids are not considered aliphatic compounds for purposes of the present invention.

As used herein, "complex" refers to a metal having one or more organic compounds associated therewith via bonds which can be ionic or covalent in nature. The nature of the bond is typically governed by the electron affinities of the respective components and the surrounding pH, and may have characteristics of both ionic and covalent bonds.

As used herein, "primary amine" refers to amines having two hydrogen atoms bonded to the nitrogen of the amine group(s). Complexing agents of the present invention can have multiple primary amine groups which can interact and complex with palladium.

As used herein, "solvated" refers to when a solute is dissolved into a solvent. A compound that is solvated indicates that at least a portion of the compound is dissolved into solution and does not necessarily indicate that all of the solute molecules are in solution.

As used herein, "electroless deposition" refers to any chemical deposition process as opposed to an electrodeposition process. Typically, electroless deposition processes involve acid baths containing metal ions, however other such processes known to those skilled in the art are considered within the scope of the present invention.

Concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a weight range of about 1% to about 20% should be interpreted to include not only the explicitly recited concentration limits of 1% to about 20%, but also to include individual concentrations such as 2%, 3%, 4%, and sub-ranges such as 5% to 15%, 10% to 20%, etc.

Palladium Aliphatic Amine Complex

In accordance with the present invention, an ink-jettable composition can include a palladium aliphatic amine complex solvated in a liquid vehicle. The palladium aliphatic amine complex can be formed using a variety of aliphatic amine complexing agents. Suitable aliphatic amine complexing agents are typically aliphatic polyamines such as diamine alkanes. Aliphatic polyamines such as triamine alkanes can also be used as a complexing agent. In one detailed aspect of the present invention, the complexing agent can be a primary polyamine. Specific non-limiting examples of such complexing agents include 1,2-diaminopropane, 1,3-diaminopropane, diethylenetriamine, 1,4-diaminobutane, 1,6-diaminohexane, N,N'-dimethyl-1,3-propanediamine, N,N,N',N'-tetramethylethylenediamine, 2-hydroxy-1,3-diaminopropane, and mixtures thereof. Other aliphatic amine complexing agents can also be used, such as straight chained and branched aliphatic amines having up to about 20 carbon atoms. Further, the aliphatic amine complexing agents can have other substituents groups including halogens such as chloride or bromide, hydroxy groups, or the like. In one embodiment of the present invention, the complexing agent can be a diamine such as 1,2-diaminopropane. The palladium complex formed with 1,2-diamino propane is shown below in a cis configuration, although the trans isomer is also typically present.

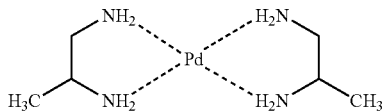

The palladium complex shown above has a positive charge of 2, and thus, a counter ion is generally present in solution. Typical counter ions include, without limitation, acetate, halides, sulfates, and mixtures thereof. Frequently, the counter ion is chloride, as a common palladium source used to produce the palladium complex is palladium chloride. The palladium complexes suitable for use in the present invention are stable over a wide range of pH. For example, palladium 1,2-diamino propane is stable and does not precipitate out of solution from a pH of about 2 to about 12. Other specific complexing agents may vary in stability. For example, tetramines are stable from a pH of about 6 to about 7. The wide range of pH stability for various complexing agents allows for significant latitude in formulating ink-jettable compositions which are tailored to various ink-jet pens, including thermal or piezoelectric printing systems. For example, in some embodiments it may be desirable to print the palladium complex with a colored ink composition, such as by simultaneous printing, overprinting, or underprinting with respect to the palladium ink-jet composition. Frequently, such color ink compositions involve pH driven bleed control mechanisms. The ink-jettable compositions of the present invention can be easily incorporated into such systems. Further, specific printhead and substrate materials may be more or less resistant to corrosion when exposed to compositions at various pH levels. In addition to a wide pH stability region, the palladium complexes of the present invention are typically present in solution. As a result, kogation and clogging problems are reduced compared to colloidal suspensions of palladium or other metals.

In one detailed embodiment, the ink-jettable composition contains excess non-complexed amine. The presence of excess complexing agent can increase the long-term stability of the composition. In the presence of excess complexing agent, the ink-jettable composition can be stable indefinitely. One factor in designing ink-jet compositions is the long-term stability of the composition in an ink-jet pen. An ink-jet composition which is stable, i.e., does not have components which readily settle or precipitate, can reduce clogging of the pen nozzles and improve performance of the ink-jet pen. Thus, it is often desirable to keep the components of the ink-jettable composition in solution for extended periods of time. The ink-jettable compositions of the present invention can include from about 2 wt % to about 28 wt % of palladium complex amine. For example, if the complexing agent is 1,2-diaminopropane, concentrations of from about 0.1 M to about 1.5 M (saturation at room temperature) can be used.

The ink-jettable composition can include a variety of components such as those typically used in ink-jet liquid vehicles, such as, but not limited to solvents, cosolvents, surfactants, biocides, buffers, viscosity modifiers, sequestering agents, colorants, stabilizing agents, humectants, water, binders, and mixtures thereof. Typically the ink-jettable compositions of the present invention have a viscosity of from about 0.8 to about 8 cPs. In one aspect of the present invention, the liquid vehicle can comprise from about 70% to about 98% by weight of the ink-jettable composition.

As described, cosolvents can be included in the ink-jettable compositions of the present invention. Suitable cosolvents for use in the present invention include water soluble organic cosolvents, but are not limited to, aliphatic alcohols, aromatic alcohols, diols, glycol ethers, poly(glycol) ethers, lactams, formamides, acetamides, long chain alcohols, ethylene glycol, propylene glycol, diethylene glycols, triethylene glycols, glycerine, dipropylene glycols, glycol butyl ethers, polyethylene glycols, polypropylene glycols, amides, ethers, carboxylic acids, esters, organosulfoxides, sulfones, alcohol derivatives, carbitol, butyl carbitol, cellosolve, ether derivatives, amino alcohols, and ketones. For example, cosolvents can include primary aliphatic alcohols of 30 carbons or less, primary aromatic alcohols of 30 carbons or less, secondary aliphatic alcohols of 30 carbons or less, secondary aromatic alcohols of 30 carbons or less, 1,2-diols of 30 carbons or less, 1,3-diols of 30 carbons or less, 1,5-diols of 30 carbons or less, ethylene glycol alkyl ethers, propylene glycol alkyl ethers, poly(ethylene glycol) alkyl ethers, higher homologs of poly (ethylene glycol) alkyl ethers, poly(propylene glycol) alkyl ethers, higher homologs of poly(propylene glycol) alkyl ethers, lactams, substituted formamides, unsubstituted formamides, substituted acetamides, and unsubstituted acetamides. Specific examples of cosolvents that can be used in the practice of this invention include, but are not limited to, 1,5-pentanediol, 2-pyrrolidone, 2-ethyl-2-hydroxymethyl-1, 3-propanediol, diethylene glycol, 3-methoxybutanol, and 1,3-dimethyl-2-imidazolidinone. Cosolvents can be added to reduce the rate of evaporation of water in the composition to minimize clogging or other properties of the composition such as viscosity, pH, surface tension, optical density, and print quality. The cosolvent concentration can range from about 0 wt % to about 50 wt %, and in one embodiment can be from about 15% to about 30% by weight. Multiple cosolvents can also be used, wherein each cosolvent can be typically present at from about 2% to about 10% by weight of the ink-jettable composition.

Various buffering agents can also be optionally used in the ink-jettable compositions of the present invention. Typical buffering agents include such pH control solutions as hydroxides of alkali metals and amines, such as lithium hydroxide, sodium hydroxide, and potassium hydroxide; and other basic or acidic components. If used, buffering agents typically comprise less than about 10% by weight of the ink-jettable composition.

In another aspect of the present invention, various biocides can be used to inhibit growth of undesirable microorganisms. Several non-limiting examples of suitable biocides include benzoate salts, sorbate salts, commercial products such as NUOSEPT (Nudex, Inc., a division of Huls America), UCARCIDE (Union Carbide), VANCIDE (RT Vanderbilt Co.), and PROXEL (ICI Americas) and other known biocides. Typically, such biocides comprise less than about 5% by weight of the ink-jettable composition and often from about 0.1% to about 0.25% by weight.

In one aspect of the present invention, the ink-jettable compositions can optionally contain surfactants. However, such components can be used and may include standard water-soluble surfactants such as alkyl polyethylene oxides, alkyl phenyl polyethylene oxides, polyethylene oxide (PEO) block copolymers, acetylenic PEO, PEO esters, PEO amines, PEO amides, and dimethicone copolyols. If used, surfactants can be from 0.01% to about 10% by weight of the ink-jettable composition.

Reducing Agent

As described, the ink-jettable compositions containing a palladium complex can be ink-jetted onto a substrate in a predetermined pattern. The predetermined pattern can correspond to a conductive pathway such as a circuit, a portion of a circuit, or other electronic device. Upon ink-jetting the palladium complex onto a substrate, the palladium generally remains in solution, and even upon drying, will not be reduced to palladium metal. Thus, a second composition including a reducing agent can be applied onto at least a portion of the predetermined pattern. The reducing agent reacts with the non-conductive palladium complex to produce conductive palladium metal. Thus, in some applications, it may be desirable to only apply reducing agent to portions of the palladium complex printed on the substrate. Further, portions of the palladium can be reduced to palladium metal followed by further steps which react or utilize the palladium metal, but do not affect the palladium complex not having reducing agent applied thereto. At a later step, the remaining palladium complex can then be reduced by applying reducing agent thereto and applying heat as described in more detail below. In an additional alternative embodiment, the reducing agent can be applied to the substrate prior to printing the palladium complex thereon. In other embodiments, the reducing agent can be applied to the entire substrate, to only the areas where the palladium aliphatic amine complex is applied.

In accordance with the present invention, a variety of reducing agents can be utilized to reduce palladium ions to palladium metal. Reducing agents suitable for use in the present invention include, but are not limited to formic acid, esters of formic acid, formic acid derivatives, hydrazine, alkali metal borohydride, oxalic acid, alkali or alkaline earth sulfites, and mixtures thereof. In one embodiment, the reducing agent can be formic acid or a derivative thereof. The reduction of palladium using formic acid produces only gases and the palladium metal, leaving no residual by-products. Other specific examples of suitable reducing agents include, esters of formic acid, e.g., formic acid ethyl ester; substituted and non-substituted amides, such as formamide and N,N-dimethyl formamide; salts of formic acid, such as sodium formate; and activated formic acids, such as orthoformic acid. As an alternative, it is also possible to carry out the reduction of palladium using a gas as the reducing agent, such as hydrogen, ethylene, propylene, isobutylene, butylene, or other olefins according to processes known to those skilled in the art.

In accordance with the present invention, the second composition containing the reducing agent can be formulated as an ink-jettable composition or applied directly to the substrate using any known method such as immersion, spraying, screen printing, or other printing techniques. The second composition can further include solvents, cosolvents, surfactants, biocides, buffers, viscosity modifiers, sequestering agents, colorants, stabilizing agents, humectants, water, binders, and mixtures thereof as discussed above in connection with the palladium complex. In one embodiment, the second composition can include pigment and/or dye colorants which can be used for aesthetic purposes or to identify specific traces. In one aspect of the present invention wherein the second composition is ink-jettable, the reducing agent can comprise from about 1 wt % to about 12 wt % of the second composition. The amount of reducing agent, such as formic acid, applied to the palladium complex printed on the substrate is most often stoichiometric or excess amounts of reducing agent.

Once the reducing agent is applied to the desired portions of the predetermined pattern, heat can be applied. The amount of heat applied to the predetermined pattern can be sufficient to cause reaction between the reducing agent and the palladium complex to form palladium metal without substantially altering or damaging the substrate. The reduction reaction can occur, albeit slowly, at room temperature and can be accelerated as heat is applied. Heat can be applied to the predetermined pattern using almost any heat source. Several exemplary heating apparatuses which act as heat sources suitable for the present invention include heater bars, heat lamps, heating plates, forced heated air, or other known sources. Typically, temperatures of from about 50° C. to about 80° C. are sufficient. However, temperatures above this range can be used if the substrate is configured such that it will not be adversely affected, e.g. mechanical integrity or electronic properties. In one aspect, temperatures of from about 50° C. to about 70° C. with a stoichiometric excess of reducing agent can reduce substantially all of the palladium complex to palladium metal in less than about 60 seconds.

After application of heat, the palladium can be reduced to the conductive palladium metal. In some embodiments of the present invention, the palladium complex can be printed such that a continuous pattern of palladium metal is formed. In such embodiments, no further processing is required and the printed conductive pathway can be used and/or incorporated into an electronic device.

Deposition of Conductive Metal

Alternatively, the palladium complex can be printed in a non-continuous pattern of palladium, wherein individual seeds of pattern provide for the deposition of a conductive metal. The non-continuous pattern can be generally formed of a series of dots which are sufficiently close that deposition of a conductive metal on the seeds or dots will ultimately connect proximate areas to form conductive pathways as desired. Deposition of the conductive metal can be accomplished using a variety of known techniques such as electroless deposition and electrodeposition. In one aspect of the present invention, the conductive metal can be deposited using an electroless process. Electroless deposition processes generally involve a substrate having a seed metal such as palladium deposited thereon. The substrate can then be immersed or exposed to a solution of a conductive metal salt and a reducing agent. Specific electroless plating compositions and conditions can be chosen by those skilled in the art to achieve various plating rates, thicknesses, and conductivities. As mentioned, those skilled in the art will also recognize that the palladium complex can also be printed in a continuous pattern to facilitate electrodeposition of a conductive metal. Any conductive metal can be used in the present invention which is capable of being deposited. Several exemplary conductive metals include copper, gold, palladium, nickel, silver, rhodium, platinum, magnetic alloys such as Co—Fe—B, Co—Ni—P, Co—Ni—Fe—B, Ni—Co, and mixtures and alloys thereof. In one aspect of the present invention, the conductive metal can be copper.

The principles of the present invention can be used to apply a conductive metal to a wide variety of substrates. As mentioned above, in accordance with the present invention, temperatures used in forming conductive pathways are frequently below 80° C. At this relatively low temperature, most substrate materials are typically not adversely affected. Substrate materials suitable for use in the present invention can include, without limitation, ceramics, polymers, cellulose, glass, silicon, and mixtures thereof. For example, the compositions of the present invention can be printed on a standard silicon substrate, polyethylene terephthalate (available from E. I. du Pont de Nemours and Company as MYLAR), polyimides (available from E. I. du Pont de Nemours and Company as KAPTON), glass, alumina ceramic, or even certain papers in some low power applications. Although the above mentioned substrates are suitable, almost any non-conductive material or flexible or non-flexible dielectric material can be used as the substrate in the present invention. In addition, the methods of the present invention can be applied to substrates having previously formed electronic circuits and/or devices thereon using any known method.

The circuits produced in accordance with the principles of the present invention can form a wide variety of electronic devices and the resolution and complexity of such pathways are only limited by the ink-jet printing technology. Circuit patterns can include, for example, complex circuits, single traces, antennae, or even multilayered circuits. Patterns formed using the ink-jettable composition of the present invention can have a linewidth of from about 5 micrometers to any practical width. Generally, a width of several millimeters is the widest practical width; however, wider conductive pathways could be formed depending on the application. Similarly, the conductive pathway can have varying thicknesses as measured from the substrate to an upper surface of the conductive pathway. The thickness of the conductive metal, if the palladium itself is used to form the conductive elements, can be easily controlled by the ink-jetting process during printing of the palladium complex. Likewise, during electroless deposition, the thickness of the conductive metal is governed by the length of time the surface is exposed to the electroless solution and the particular solution and concentrations used. Typically, thicknesses of from about 0.2 micrometers to about 3 micrometers are desirable for most electronic devices.

Using the methods described herein, almost any known predetermined pattern forming an electronic structure can be prepared, such as, but not limited to, gates, transistors, diodes, resistors, inductors, capacitors, traces, magnets, and other circuit elements. The present invention allows the production of a wide variety of devices in a short period of time and with minimal preparation which normally accompanies standard lithography techniques of preparing a mask, deposition, etching, etc. Thus, prototypes of complex patterns can be tested and adjusted without time consuming lithography steps.

In one aspect of the present invention, the predetermined pattern can be printed in multiple layers to form three dimensional structures. For example, a first layer containing a predetermined pattern can be produced by printing the palladium complex and forming a conductive pathway using any of the above described embodiments. A layer of insulating or semiconducting material of a polymeric resin, organic resin, doped ceramic, semiconductor, or the like can be formed over the first layer. Most often, the insulating layer can be discontinuous having conduits or holes in which additional conductive metal can be placed. These holes can be formed after the deposition of the insulating material using standard lithography technologies. A conductive metal can then be printed using the methods of the present invention, or otherwise deposited. Often electroless deposition is suitable since the holes leave only selected areas of the underlying predetermined pattern of conductive metal exposed. Alternatively, the holes can be formed by printing a material prior to forming the insulating material which prevents the insulating material or semi-conducting material from adhering to the predetermined pattern at specific locations. A second layer of conductive circuits or pathways can then be printed on the insulating material using the above principles. This process can be repeated as many times as needed to form a desired multilayer circuit.

System Incorporating Ink-Jettable Compositions

A variety of techniques can be used to form conductive pathways on various substrates. In one embodiment of the present invention, a system for forming electrically conductive pathways on a substrate comprises a first printhead, a second printhead, and a heating apparatus. An ink-jet printer, for example, can be used to propel ink-jet compositions onto substrates using resistive heating elements or piezoelectric elements for propelling the composition through an overlying orifice plate. The ink-jet compositions can be stored in a reservoir and the composition can travel through a set of channels toward the orifice plate. In connection with the present invention, the first printhead can have a first firing chamber reservoir containing a first ink-jettable composition. The first ink-jettable composition can include a first liquid vehicle and a palladium aliphatic amine complex solvated therein, as described previously. The second printhead can have a second firing chamber reservoir containing a second ink-jettable composition. This second ink-jettable composition can include a second liquid vehicle and a reducing agent. It will be understood that the first and second printhead can be present on a common orifice plate, although not commonly done, or on separate orifice plates. Typically, a common orifice plate configuration would benefit from the use of non-reactive liquid vehicles in order to reduce clogging. Additionally, the first and second printheads can be contained within multiple housings or a single housing. Further, a heating apparatus can be placed in thermal contact with the substrate. The heating apparatus can supply heat to the predetermined pattern such that the palladium complex is reduced to palladium metal. The heating apparatus can be a heater bar or lamp placed in a heat conductive relationship to the printed substrate. Alternatively, the substrate can be heated using a heating plate or other heating device subsequent to printing the palladium aliphatic amine complex and the reducing agent thereon. The above described components can be incorporated into flatbed printers or standard ink-jet printers which have been modified to print on rigid or flexible substrates, such as optical disks or circuit boards. Generally, a modified ink-jet printer would include inserts which securely hold and move such substrates past the ink-jet printheads.

EXAMPLES

The following examples illustrate the embodiments of the invention that are presently best known. However, it is to be understood that the following are only exemplary or illustrative of the application of the principles of the present invention. Numerous modifications and alternative compositions, methods, and systems may be devised by those skilled in the art without departing from the spirit and scope of the present invention. The appended claims are intended to cover such modifications and arrangements. Thus, while the present invention has been described above with particularity, the following examples provide further detail in connection with what are presently deemed to be practical embodiments of the invention.

Example 1

A solution of 0.1 M bis(1,2-diaminopropyl) palladium (II) chloride is prepared in an aqueous liquid vehicle to produce a palladium complex composition. A 0.2 M aqueous solution of formic acid is also prepared. A syringe is filled with the palladium complex composition. A row of drops are then deposited on each of the following substrates: KAPTON (a polyimide), alumina ceramic, and glass. A second syringe is filled with the formic acid solution and the solution applied to the same areas as the palladium complex composition. The substrates are allowed to sit at room temperature for about thirty minutes wherein no noticeable reduction of palladium is observed. The above process is repeated to produce three more sample substrates having the palladium complex deposited thereon. All six of the substrates are then placed on a hotplate and heated to about 70° C. As the water evaporates, black traces of palladium form from the palladium complex. A repeat of the above procedure (with the heating step) without the addition of the formic acid solution does not produce black traces of palladium metal.

Example 2

To 10 g of deionized water is added 10 g of 0.2 M bis(1,2-diaminopropyl) palladium (II) chloride. To this solution 1 g of 2-methyl-1,3-propanediol (MP diol) and 1 g of 1,2 ethylhydroxy-2-pyrrolidone is thoroughly stirred. About 0.01 g of biocide is then added to form an ink-jettable composition of palladium complex. A reducing agent composition is prepared by adding 1 g of 2-methyl-1,3-propanediol and 1 g of 1,2 ethylhydroxy-2-pyrrolidone to 20 g of 0.2 M formic acid. These ink-jettable compositions are placed into separate ink-jet pens and placed in a standard ink-jet printer. After printing a desired circuit pattern on a glass substrate, the substrate is heated to about 70° C. for about 2 minutes to form a pattern of dots to be used as seed for electroless deposition of copper. The substrate is then immersed in an electroless copper plating bath (Envision EC-2132 available from Enthone, Inc.) for 30 minutes to form conductive pathways.

It is to be understood that the above-referenced arrangements are illustrative of the application for the principles of the present invention. Numerous modifications and alternative arrangements can be devised without departing from the spirit and scope of the present invention while the present invention has been shown in the drawings and described above in connection with the exemplary embodiments(s) of the invention. It will be apparent to those of ordinary skill in the art that numerous modifications can be made without departing from the principles and concepts of the invention as set forth in the claims.

What is claimed is:

1. A method of forming an electrically conductive pathway, comprising steps of:
    a) jetting a first ink-jettable composition onto a substrate, said first composition including a first liquid vehicle and a palladium aliphatic amine complex solvated therein;
    b) overprinting or underprinting a second composition with respect to at least a portion of the first ink-jettable composition to form a predetermined pattern, said second composition including a second liquid vehicle and reducing agent solvated therein; and
    c) applying heat to the predetermined pattern sufficient to cause reaction between the reducing agent and the palladium aliphatic amine complex to form palladium metal without substantially altering the substrate.

2. The method of claim 1, further comprising depositing a conductive metal onto the palladium metal.

3. The method of claim 2, wherein the conductive metal is selected from the group consisting of copper, gold, palladium, nickel, silver, rhodium, platinum, Co—Fe—B, Co—Ni—P, Co—Ni—Fe—-B, Ni—Co, and mixtures or alloys thereof.

4. The method of claim 2, wherein the step of depositing is an electroless deposition process.

5. The method of claim 2, wherein the predetermined pattern is a non-continuous pattern of palladium aliphatic amine complex which, once reduced, is a seed for deposition of the conductive metal.

6. The method of claim 1, wherein the second composition is underprinted with respect to the first ink-jettable composition.

7. The method of claim 1, wherein the second composition is overprinted with respect to the first ink-jettable composition.

8. The method of claim 1, wherein the aliphatic amine of the palladium aliphatic amine complex is selected from the group consisting of diamine alkanes, triamine alkanes, and mixtures thereof.

9. The method of claim 8, wherein the aliphatic amine is 1,2-diaminopropane.

10. The method of claim 1, wherein the substrate comprises a member selected from the group consisting of ceramics, polymers, cellulose, silicon, and mixtures thereof.

11. The method of claim 1, wherein the step of applying the second composition is by ink-jetting, said second composition being ink-jettable.

12. The method of claim 1, wherein the second composition further comprises a colorant.

13. The method of claim 1, wherein the first composition further comprises a colorant.

14. The method of claim 1, wherein the reducing agent is selected from the group consisting of formic acid, esters of formic acid, formic acid derivatives, hydrazine, alkali metal borohydride, oxalic acid, alkali or alkaline earth sulfites, and mixtures thereof.

15. The method of claim 14, wherein the reducing agent is formic acid.

16. The method of claim 1, wherein the step of applying heat occurs at from about 50° C. to about 80° C.

17. The method of claim 1, wherein the predetermined pattern is a circuit.

18. The method of claim 1, wherein the first liquid vehicle further comprises non-complexed amine.

* * * * *